United States Patent
Yamagami

(10) Patent No.: US 12,119,842 B2
(45) Date of Patent: Oct. 15, 2024

(54) AUDIO SIGNAL PROCESSING CIRCUIT

(71) Applicant: ROHM CO., LTD., Kyoto (JP)

(72) Inventor: Shinji Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 155 days.

(21) Appl. No.: 17/849,956

(22) Filed: Jun. 27, 2022

(65) Prior Publication Data

US 2022/0329257 A1   Oct. 13, 2022

Related U.S. Application Data

(63) Continuation of application No. PCT/JP2020/046077, filed on Dec. 10, 2020.

(30) Foreign Application Priority Data

Dec. 27, 2019   (JP) ................ 2019-239619

(51) Int. Cl.
*H03M 3/00* (2006.01)
*H03H 17/06* (2006.01)
*H03M 3/02* (2006.01)
*H03M 1/68* (2006.01)

(52) U.S. Cl.
CPC ............. *H03M 3/50* (2013.01); *H03H 17/06* (2013.01); *H03M 3/02* (2013.01); *H03M 1/687* (2013.01)

(58) Field of Classification Search
CPC .......... H03M 3/50; H03M 3/02; H03M 1/687; H03H 17/06; H04M 7/04
See application file for complete search history.

(56) References Cited

U.S. PATENT DOCUMENTS

| 9,748,929 | B1 | 8/2017 | Lamb et al. |
| 2001/0033650 | A1* | 10/2001 | Wilson ............ H04B 3/54 379/406.01 |
| 2015/0106519 | A1* | 4/2015 | Lu ................ H04W 4/20 709/225 |

FOREIGN PATENT DOCUMENTS

| JP | H08186498 A | 7/1996 |
| JP | 2005005766 A | 1/2005 |
| JP | 2012039398 A | 2/2012 |

OTHER PUBLICATIONS

International Search Report for International Application No. PCT/JP2020/046077; Date of Mailing, Feb. 16, 2021.
PCT International Preliminary Report on Patentability with Written Opinion of the International Searching Authority for International Application No. PCT/JP2020/046077; Date of Mailing, Feb. 16, 2021.
JPO Notification of Reason(s) for Refusal for corresponding JP Application No. 2021-567211; Issued Jun. 18, 2024; 5 pages.

* cited by examiner

*Primary Examiner* — Joseph J Lauture
(74) *Attorney, Agent, or Firm* — CANTOR COLBURN LLP

(57) ABSTRACT

An oversampling filter oversamples a digital audio signal. A ΔΣ modulator delta-sigma modulates a signal output from the oversampling filter. A D/A converter converts a signal output from the ΔΣ modulator into an analog audio signal. The oversampling filter includes a processor configured to run firmware and a computational algorithm is configurable based on the firmware.

4 Claims, 3 Drawing Sheets

AUDIO SIGNAL PROCESSING CIRCUIT

CROSS REFERENCE TO RELATED APPLICATIONS

This application is a continuation under 35 U.S.C. § 120 of PCT/JP2020/046077, filed Dec. 10, 2020, which is incorporated herein by reference, and which claimed priority to Japanese Application No. 2019-239619, filed Dec. 27, 2019. The present application likewise claims priority under 35 U.S.C. § 119 to Japanese Application No. 2019-239619, filed Dec. 27, 2019, the entire content of which is also incorporated herein by reference.

BACKGROUND

1. Technical Field

The present disclosure relates to an audio signal processing circuit.

2. Description of the Related Art

In some cases of audio signal processing, an oversampling filter is inserted upstream of a D/A converter to improve sound quality. The oversampling filter is also referred to as an interpolator, an interpolation filter, or the like and is used to sample an input signal at a frequency substantially higher than the Nyquist frequency. Oversampling is capable of improving S/N ratio and resolution as well as of relaxing requirements for an anti-aliasing filter inserted downstream of the D/A converter.

FIG. 1 shows graphs illustrating an oversampling process. Oversampling by a factor of K involves inserting K−1 pieces of zeros between samples of an input signal $S_{IN}$ (upsampling). FIG. 1 shows an example given when K=4. Then, the audio signal after upsampling is passed through a linear phase digital filter to generate an oversampled signal.

The digital filter is a finite impulse response (FIR) filter or an infinite impulse response (IIR) filter and properties of the filter have a significant influence on sound quality. Some conventional audio signal processor ICs allow the selection of a set of coefficients for the FIR filter or allow the loading of a set of coefficients made by a set designer. Accordingly, the set designer is required to design a set of coefficients as a parameter and make sound quality of the audio signal more similar to desired quality.

SUMMARY

The sound quality of audio signals is significantly influenced by a computational algorithm as well as a set of coefficients of a digital filter. However, conventional audio signal processor ICs provide a fixed computational algorithm for a digital filter and leave no room for the set designer to change the computational algorithm, putting a constraint on flexibility in sound quality design. Such a problem was independently recognized by the inventors of the present disclosure.

The present disclosure has been made in view of the above problem.

An embodiment of the present disclosure relates to an audio signal processing circuit. The audio signal processing circuit includes: an oversampling filter to oversample a digital audio signal; a ΔΣ modulator to delta-sigma modulate a signal output from the oversampling filter; and a D/A converter to convert a signal output from the ΔΣ modulator into an analog audio signal. The oversampling filter includes a processor configured to run firmware and a computational algorithm is configurable based on the firmware.

The firmware (software) can be rewritten, and the computational algorithm of a digital filter can be thereby changed. This enables a set designer to make sound quality more similar to desired quality.

The audio signal processing circuit may be capable of loading a plurality of sets of coefficients for the oversampling filter, and the audio signal processing circuit may enable the set of coefficients that is to be used to be selected in response to a register setting.

Each of the sets of the coefficients may be loaded in an encrypted state. The audio signal processing circuit may further include a decoder to decode each of the encrypted sets of coefficients. The sets of coefficients are confidential information containing a wealth of know-how for the set designer. Encrypting the sets of coefficients prevents a malicious third party from secretly looking at the sets of coefficients.

Another embodiment of the present disclosure is also an audio signal processing circuit. The audio signal processing circuit includes: an oversampling filter to oversample a digital audio signal; an interface circuit to receive a set of coefficients for the oversampling filter, the set of coefficients being encrypted; and a decoder to decode the set of coefficients received by the interface circuit and put the decoded set of coefficients in the oversampling filter.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
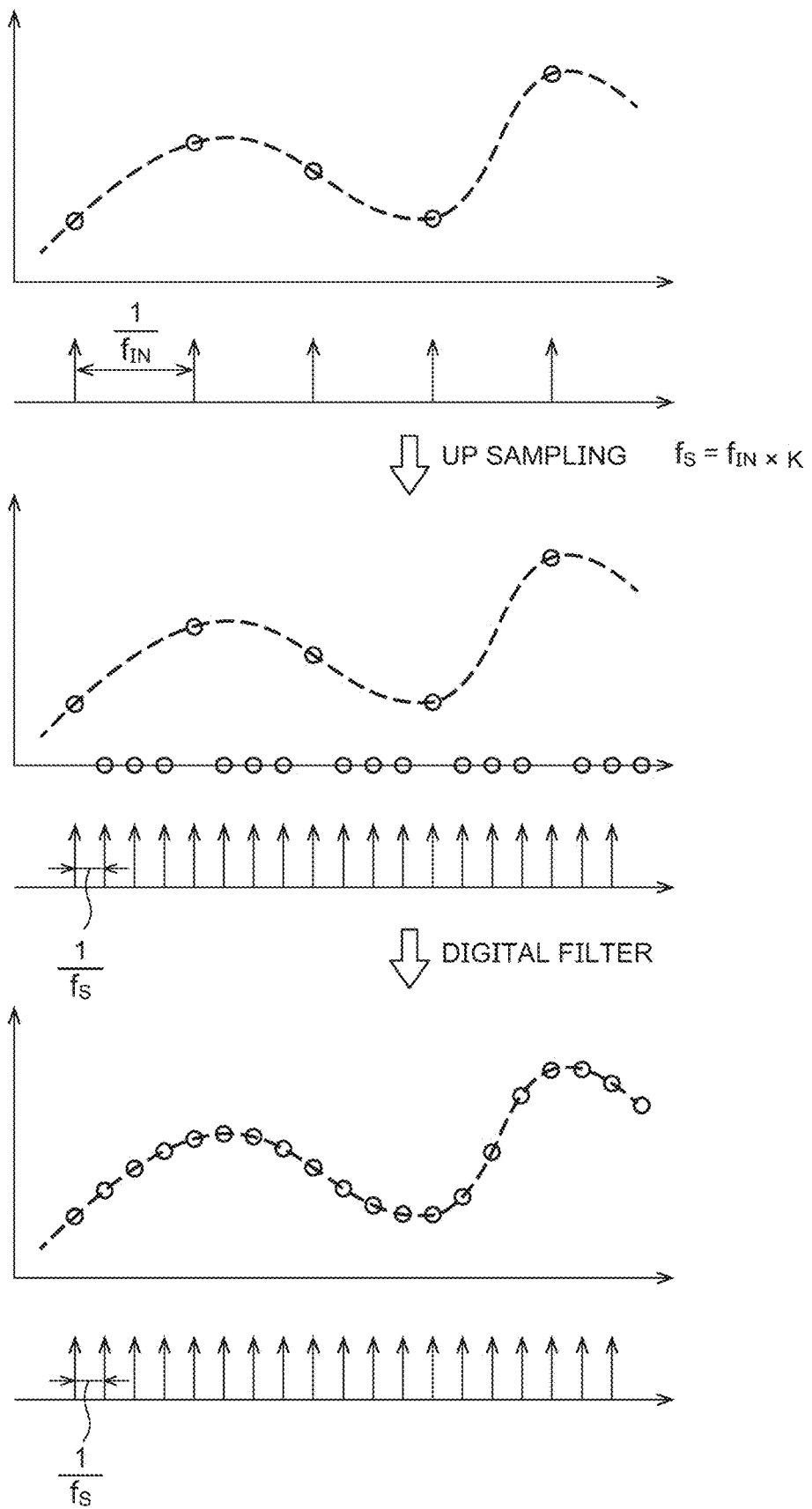
FIG. 1 shows graphs illustrating an oversampling process.

A preferred embodiment will now be described with reference to the drawings. Identical reference marks are assigned to identical or equivalent components, members, processes illustrated in the drawings, and the repeated description thereof is omitted as appropriate. The embodiment is an exemplification and should not limit the disclosure. All the features described in the embodiment and a combination thereof are not necessarily essential to the disclosure.

In the present specification, a "state in which a member A is connected to a member B" includes not only a case in which the member A and the member B are physically and directly connected to each other but also a case in which the member A and the member B are indirectly connected to each other through another member that does not have a substantial influence on electrical connection between these members or that does not impair a function or an effect produced by a coupling between these members.

Similarly, a "state in which a member C is disposed between a member A and a member B" includes not only a case in which the members A and C or the members B and C are directly connected to each other but also a case in which the two members are indirectly connected to each other through the other member that does not have a substantial influence on electrical connection between the two members or that does not impair a function or an effect produced by a coupling between the two members.

Figure 2:
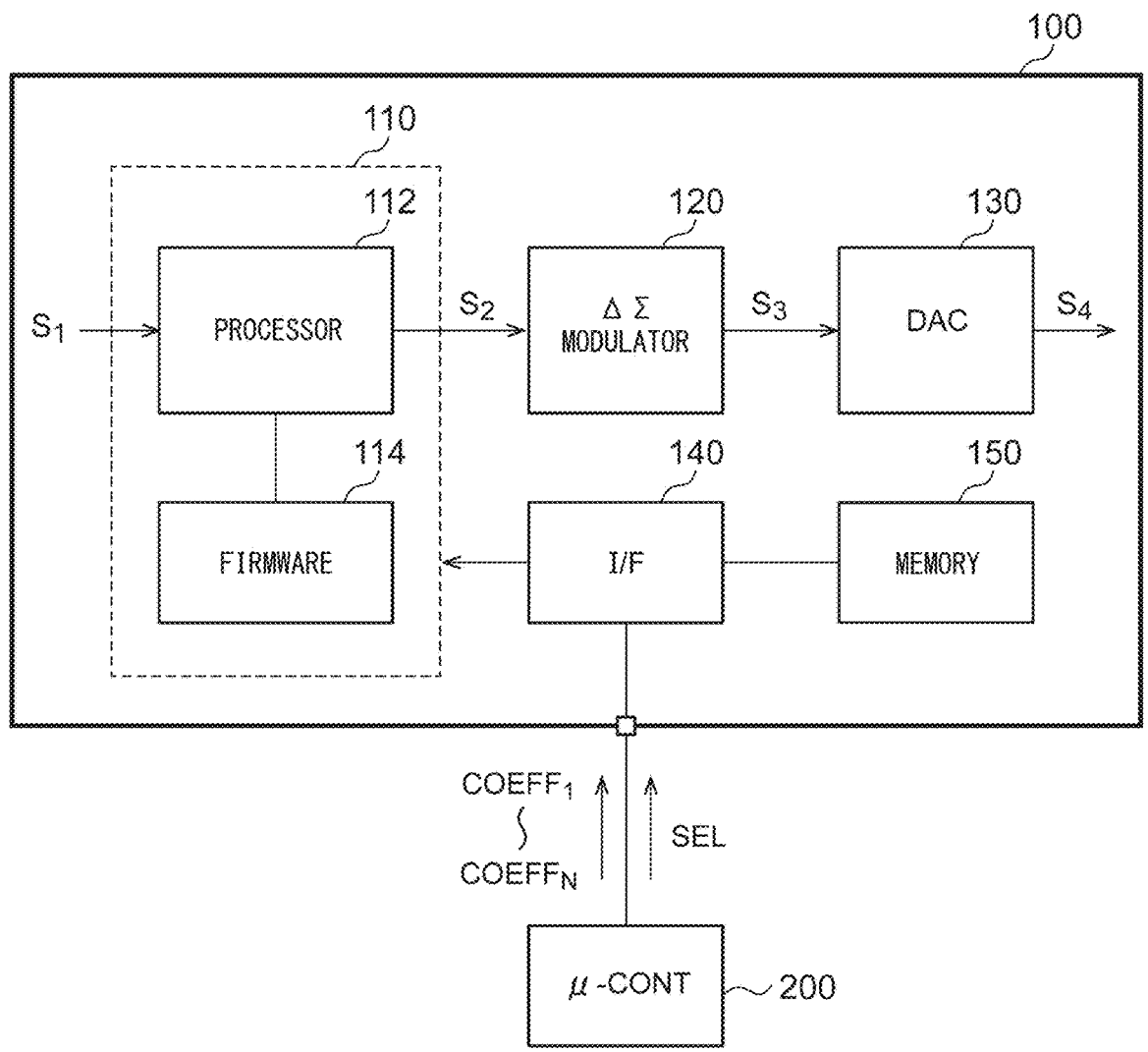
FIG. 2 is a block diagram of an audio signal processing circuit according to an embodiment of the present disclosure.

FIG. 2 is a block diagram of an audio signal processing circuit 100 according to an embodiment of the present disclosure. The audio signal processing circuit 100 primarily includes an oversampling filter 110, a ΔΣ modulator 120, and a D/A converter 130, which are monolithically integrated on a single semiconductor substrate. The audio signal processing circuit 100 may be, for example, a DAC (D/A converter) chip or a digital signal processor (DSP) that is more advanced than the DAC chip.

The oversampling filter 110 oversamples a digital audio signal $S_1$. The ΔΣ modulator 120 delta-sigma modulates a signal $S_2$ output from the oversampling filter 110. The D/A converter 130 converts a signal $S_3$ output from the ΔΣ modulator 120 into an analog audio signal $S_4$.

The oversampling filter 110 includes a processor 112 and memory 114. The processor 112 is configured to run firmware (a software program) stored in the memory 114. The firmware contains written code to implement a function of the oversampling filter 110. In other words, a computational algorithm in the oversampling filter 110 is editable. Read-only memory (ROM) used to store the firmware may be built in or attached to the audio signal processing circuit 100 or, alternatively, the firmware may be loaded from ROM via an external host processor (a microcontroller).

A configuration of the audio signal processing circuit 100 has been described above. According to the audio signal processing circuit 100, the firmware (software) can be rewritten and the computational algorithm of a digital filter can be thereby changed. This enables a set designer to make sound quality more similar to desired quality.

A key parameter of the digital filter is a set of filter coefficients COEFF. The digital filter is a FIR filter, and the set of coefficients COEFF is understood as impulse response waveforms. In one example, the audio signal processing circuit 100 is configured to be able to load a set of filter coefficients from outside. The firmware may contain default values of the set of filter coefficients COEFF and may be designed to selectively use either the default values or loaded values.

The audio signal processing circuit 100 further includes an interface circuit 140 such as an Inter-Integrated Circuit (I²C) and a memory 150. The interface circuit 140, which is connected to an external host processor 200, receives the set of coefficients COEFF from the host processor 200 and stores the set of coefficients COEFF in the memory 150. The memory 150 may be a register or may be random-access memory (RAM) if a number of taps is large. As a result, in addition to the computational algorithm, the set of coefficients COEFF can be changed, allowing the set designer to determine sound quality with improved flexibility.

The audio signal processing circuit 100 is capable of loading a plurality of sets of coefficients $COEFF_1$ to $COEFF_N$ (N≥2). For instance, when the audio signal processing circuit 100 starts, the audio signal processing circuit 100 loads the plurality of the sets of coefficients $COEFF_1$ to $COEFF_N$ from the host processor 200 and stores the loaded sets of coefficients in the memory 150. The host processor 200 sends selection data SEL to the interface circuit 140 to specify a set of coefficients $COEFF_i$ (1≤i≤N) that is to be actually used and writes the selection data SEL onto the memory 150. Out of the plurality of the sets of coefficients $COEFF_1$ to $COEFF_N$, one set that corresponds to the selection data SEL written onto the memory 150 is put in the oversampling filter 110.

If only one set of coefficients can be loaded, changing the set of coefficients requires another set of coefficients to be reloaded, causing a substantial delay. In contrast to this, the audio signal processing circuit 100 in FIG. 2 enables switching between sets of coefficients simply by sending of the selection signal SEL. This provides improved responsiveness.

Figure 3:
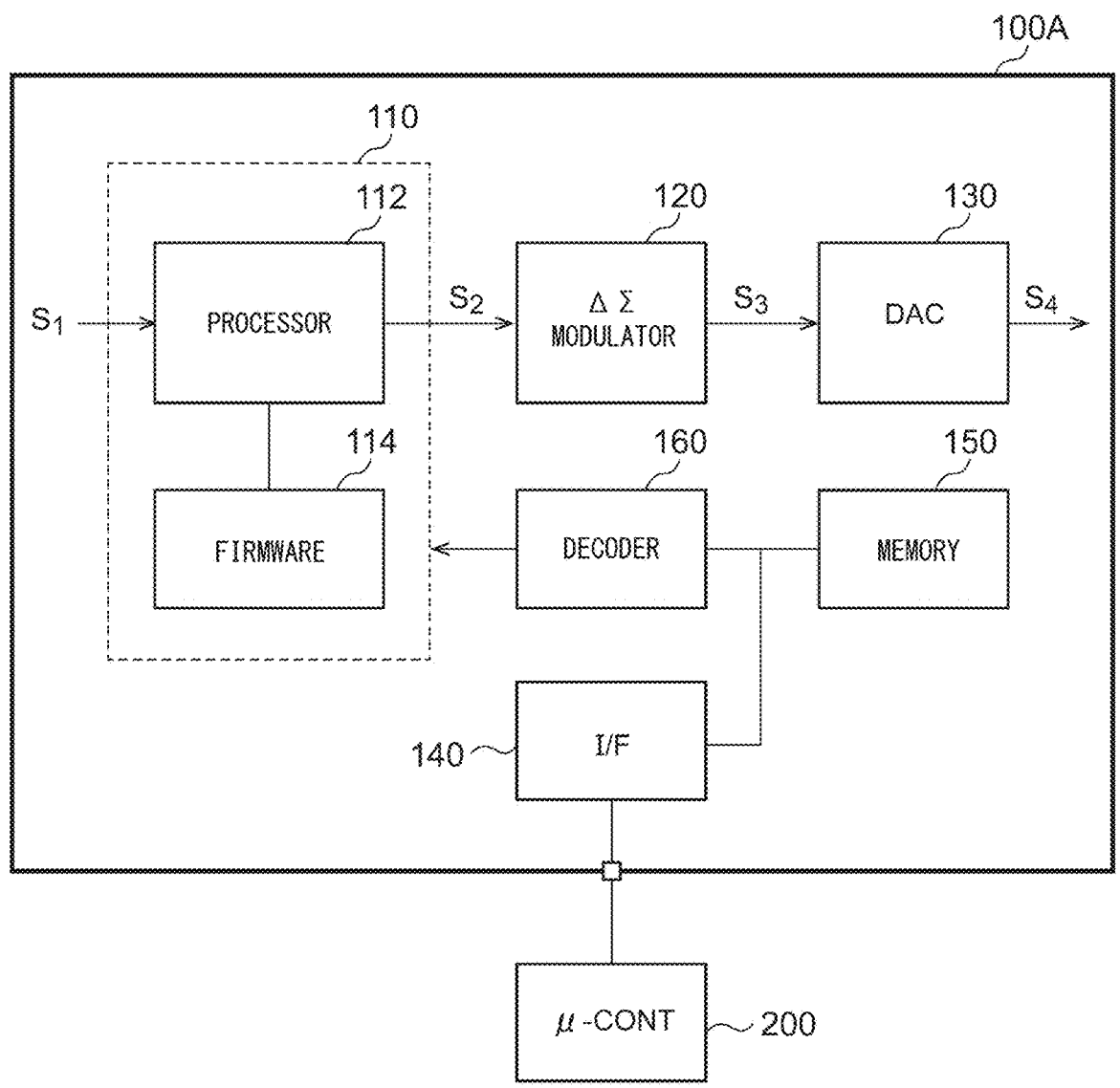
FIG. 3 is a block diagram of an audio signal processing circuit according to a modification of the embodiment of the present disclosure.

FIG. 3 is a block diagram of an audio signal processing circuit 100A according to a modification of the embodiment of the present disclosure. The audio signal processing circuit 100A further includes a decoder 160.

The set of coefficients COEFF is confidential information containing a wealth of know-how for the set designer. If the set of coefficients COEFF can be loaded, it is feared that a malicious third party could secretly look at communications between the audio signal processing circuit 100 and the host process 200, resulting in a leakage of the set of coefficients COEFF.

The set of coefficients COEFF is sent from the host processor 200 to the interface circuit 140 in an encrypted state. The audio signal processing circuit 100A includes the decoder 160 to decode the encrypted set of coefficients COEFF. The set of decoded coefficients COEFF is put in the digital filter of the oversampling filter 110.

According to the modification of the embodiment, even if a malicious third party secretly looks at communications between the host process 200 and the interface circuit 140, a leakage of the set of coefficients COEFF can be prevented unless an encryption protocol or a secret key is leaked.

The embodiment is intended only for illustration of the principle and applications of the present disclosure. It should be understood that various modifications or altered arrangements may be made to the embodiment within the scope of the present disclosure as defined by the appended claims.

What is claimed is:

1. An audio signal processing circuit comprising:
    an oversampling filter structured to oversample a digital audio signal;
    a ΔΣ modulator structured to delta-sigma modulate a signal output from the oversampling filter; and
    a D/A converter structured to convert a signal output from the ΔΣ modulator into an analog audio signal,
    wherein the oversampling filter includes a processor structured to run firmware and a computational algorithm is configurable based on the firmware,
    wherein the audio signal processing circuit is structured to load a plurality of sets of coefficients for the oversampling filter, and
    wherein the audio signal processing circuit enables the set of coefficients that is to be used to be selected in response to a register setting.

2. The audio signal processing circuit according to claim 1,
    wherein each of the sets of coefficients is loaded in an encrypted state, and the audio signal processing circuit further comprises a decoder structured to decode each of the encrypted sets of coefficients.

3. The audio signal processing circuit according to claim 1, wherein the audio signal processing circuit is monolithically integrated on a semiconductor substrate.

4. An audio signal processing circuit comprising:
   an oversampling filter structured to oversample a digital audio signal;
   an interface circuit structured to receive a set of coefficients for the oversampling filter, the set of coefficients being encrypted; and
   a decoder structured to decode the set of coefficients received by the interface circuit and put the decoded set of coefficients in the oversampling filter.

* * * * *